(12) United States Patent
Schüler

(10) Patent No.: US 10,489,622 B2
(45) Date of Patent: Nov. 26, 2019

(54) METHOD OF READING AN OPTICAL CODE AND OPTOELECTRONIC CODE READER

(71) Applicant: SICK AG, Waldkirch (DE)

(72) Inventor: Pascal Schüler, Waldkirch (DE)

(73) Assignee: SICK AG, Waldkirch (DE)

( * ) Notice: Subject to any disclaimer, the term of this patent is extended or adjusted under 35 U.S.C. 154(b) by 0 days.

(21) Appl. No.: 16/019,763

(22) Filed: Jun. 27, 2018

(65) Prior Publication Data
US 2019/0018996 A1 Jan. 17, 2019

(30) Foreign Application Priority Data
Jul. 13, 2017 (EP) ..................................... 17181248

(51) Int. Cl.
*G06K 7/14* (2006.01)
*G06K 9/03* (2006.01)
*H03M 13/29* (2006.01)

(52) U.S. Cl.
CPC ......... *G06K 7/1473* (2013.01); *G06K 7/1404* (2013.01); *G06K 7/1417* (2013.01); *G06K 9/03* (2013.01); *H03M 13/2918* (2013.01)

(58) Field of Classification Search
CPC .... G06K 7/1473; G06K 9/03; H03M 13/2918
See application file for complete search history.

(56) References Cited

U.S. PATENT DOCUMENTS

| | | | |
|---|---|---|---|
| 5,553,084 A | 9/1996 | Ackley et al. | |
| 5,880,451 A | 3/1999 | Smith et al. | |
| 6,330,972 B1 | 12/2001 | Wiklof et al. | |
| 6,371,371 B1 * | 4/2002 | Reichenbach | G06K 7/10851 235/454 |
| 8,910,866 B2 * | 12/2014 | Schuler | G06K 5/00 235/437 |

* cited by examiner

*Primary Examiner* — Seung H Lee
(74) *Attorney, Agent, or Firm* — Nath, Goldberg & Meyer; Jerald L. Meyer

(57) ABSTRACT

A method of reading an optical code (20) is provided that has a plurality of code words, wherein image data having the optical code (20) are recorded and evaluated to read out the code words, and wherein it is determined by a test process whether the code is read correctly. In this respect, a code word at at least one position of the code (20) is replaced with a code word known for this position in a pre-correction and the test process is carried out after the pre-correction.

10 Claims, 2 Drawing Sheets

Figures 1, 2:
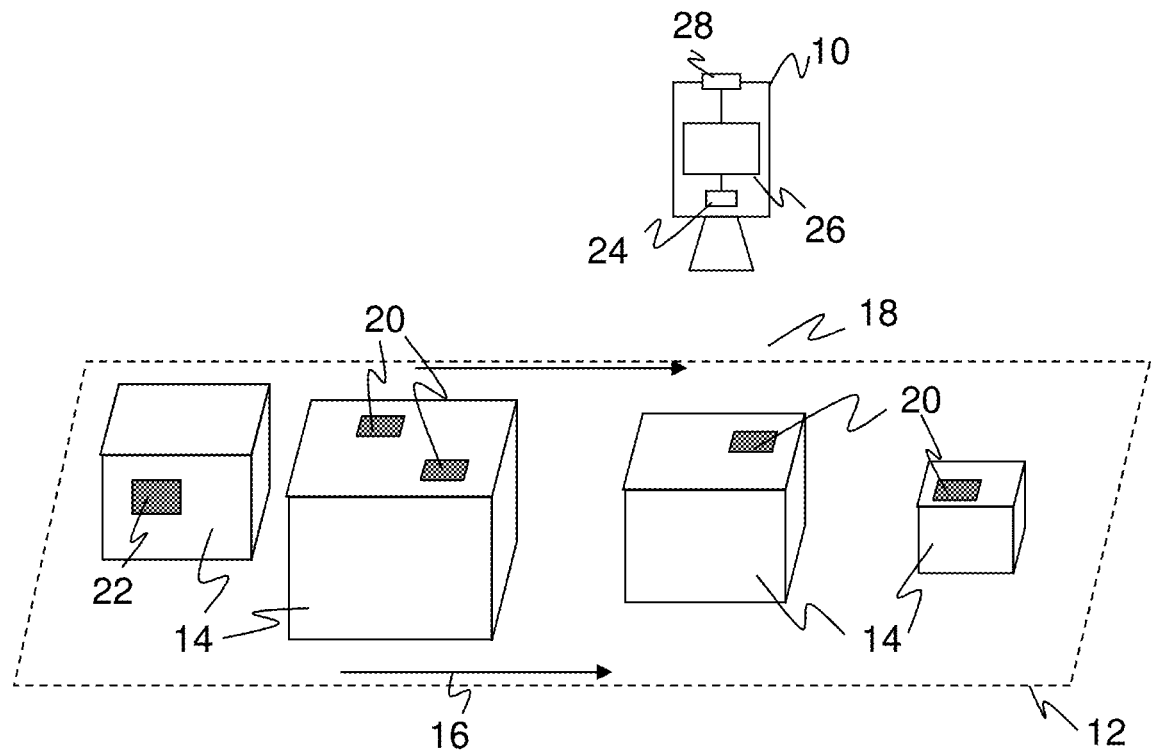

A
| | | |
|---|---|---|
| Data Matrix | 010871848116971121N3C18S2CTV1C<1d>240FA062838.03 | 45 |
| Data Matrix | 010871848116971121JS53T65H9S8H<1d>240FA062838.03 | 45 |
| Data Matrix | 0108718481169711215TFGQ6GPHYP1<1d>240FA062838.03 | 45 |
| Data Matrix | 0108718481169711218KRAFP7YTWZ3<1d>240FA062838.03 | 45 |
| Data Matrix | 0108718481169711219HXJ9UZ4L69U<1d>240FA062838.03 | 45 |

B
| | | |
|---|---|---|
| Data Matrix | 010871848116971121JS53T65H9S8H<1d>240FA062838.03 | 45 |
| Data Matrix | 010871848116971121TFYSLH6XH4ZK<1d>240FA062838.03 | 45 |

Fig. 3

|  | CW1 | CW2 | CW3 | CW4 | CW5 | CW6 | CW7 | CW8 |
|---|---|---|---|---|---|---|---|---|
| *Old CW_repetition* | 77 | 80 | 85 | 46 | 197 | 214 | -1 (MARKER) | 129 (Pad-CW) |
| Current GoodRead CWs | 77 | 80 | 85 | 46 | 197 | 183 | 161 | 129 (Pad-CW) |
| *New CW_repetition* | 77 | 80 | 85 | 46 | 197 | -1 (MARKER) | -1 (MARKER) | 129 (Pad-CW) |

Fig. 4

|  | CW1 | CW2 | CW3 | CW4 | CW5 | CW6 | CW7 | CW8 |
|---|---|---|---|---|---|---|---|---|
| *New CW_repetition* | 77 | 80 | 85 | 46 | 197 | -1 (MARKER) | -1 (MARKER) | 129 (Pad-CW) |
| Decodes to : | L | O | T | - | 6 7 |  |  | ---- |

Fig. 5

|  | CW1 | CW2 | CW3 | CW4 | CW5 | CW6 | CW7 | CW8 |
|---|---|---|---|---|---|---|---|---|
| *CW_repetition* | 77 | 80 | 85 | 46 | 197 | -1 (MARKER) | -1 (MARKER) | 129 (Pad-CW) |
| Current NoRead CWs | 99 | 17 | 18 | 88 | 197 | 188 | 162 | 129 (Pad-CW) |
| Applied own correction with *CW_repetition* | 77 | 80 | 85 | 46 | 197 | 188 | 162 | 129 |
| RS correction | 77 | 80 | 85 | 46 | 197 | 214 | 162 | 129 |
| Decodes to : | L | O | T | - | 6 7 | 8 4 | 3 2 | ---- |

METHOD OF READING AN OPTICAL CODE AND OPTOELECTRONIC CODE READER

The invention relates to a method of reading an optical code, the optical code having a plurality of code words, wherein image data having the optical code are recorded and evaluated to read out the code words, and wherein it is determined by a test process whether the code is read correctly. The invention further relates to an optoelectronic code reader having at least one light reception element for generating image data from received light and having an evaluation unit in which a method of reading optical codes is implemented.

Code readers are known from supermarket checkouts, for automatic parcel identification, for sorting mail shipments, from baggage handling at airports, and from other logistics applications. In a code reader, a reading beam is guided transversely over the code by means of a rotating mirror or of a polygonal mirror wheel. A camera-based code reader takes images of the objects having the codes located thereon by means of an image sensor and image evaluation software extracts the code information from these images.

In an important application group, the objects bearing the code are conveyed past the code reader. A scanning code reader here detects the respective codes successively led into its reading zone. Alternatively, in a camera based code reader, a line scan camera reads in the object images having the code information successively and linewise with the relative movement. As a rule, image data are recorded using a two-dimensional image sensor that overlap more or less depending on the recording frequency and on the conveying speed. So that the objects can be arranged in any desired orientation on the conveyor, a plurality of code readers are often provided at a reading tunnel to record objects from a plurality of sides or from all sides. A scanning code reader also detects the remission and thus ultimately the image lines that can be assembled to an object image, even though an image sensor is preferred for this purpose in practice. Code regions can be identified in such an object field and one-dimensional or two-dimensional codes can be read out.

One of the most important quality criteria for a code reader or for a reading tunnel is a high reading rate. Reading errors make complex error remedies necessary such as the repeat manual scanning or a resorting.

To avoid reading errors, conventional decoders, in particular for two-dimensional codes such as DataMatrix, QR, Aztec, Maxicode, Dot Code, or also stack codes such as PDF417 and MicroPDF, are equipped with a Reed-Solomon error correction that allows a specific number of errors to be corrected. The cause for such errors can lie in the quality of the code itself, in an unfavorable reading situation such as under a film that causes reflections, and finally also in evaluation errors, for example in the binarization of gray values or imprecisely calculated scanning positions.

In the code word sequence of a Reed-Solomon code, correction code words, of which one is required for the localization of the error position and a second one is required for the correction of the erroneous value, are also provided in addition to the data words having the actual code information. The number of correction code words is predefined by the specification of the code type. This accordingly restricts the number of errors correctable as a maximum. The correction capacity is respectively dependent on the symbol size of the code and, in some code types such as QR and PDF417, also on the error level used. The error level is here fixed by the generator of the code in the encoding process.

If therefore more errors are present in the code word sequence than can be corrected by means of Reed-Solomon or if the correction capacity is exceeded, the code can no longer be read and all the decoder can do is to return a failure (no read) or, somewhat more specifically, a Reed-Solomon error.

Binarization has already been named as a conceivable cause of reading errors. There is an approach in the prior art called the weak bit algorithm to insert a modification prior to the Reed-Solomon in the attempt to exceed the Reed-Solomon capacity. In this respect, scan points are identified in a brute force process whose gray values are close to the binarization threshold and at which it is thus questionable whether the module was able to be correctly classified with respect to its polarity. The binarization results at such modules classified as critical are then permuted and a decoding attempt is respectively carried out again with the Reed-Solomon correction at each permutation. The aim is to find the correct combination by systematic trial and error in which the code can be read without exceeding the Reed-Solomon correction capacity.

This procedure is critical with regard to run time due to the blind permutation. In addition, misreads are also possible, above all with textures incorrectly recognized as the code region, due to the largely random trial and error, at least with small symbol sizes. In any case, only binarization errors can be corrected, but not other reading errors whose causes lie before the evaluation in the code detection, for instance destruction in the data zone due to reflections of a film over the code.

There is consequently no satisfactory possibility in the prior art to exceed the capacity of the Reed-Solomon correction.

It is therefore the object of the invention to provide an even more reliable and more robust method of reading optical codes.

This object is satisfied by a method of reading an optical code and by a corresponding code reader in accordance with the respective independent claim. First, image data of the optical code are recorded in one of the known ways and code regions are localized therein, preferably by a preprocessing that segments the image data with reference to the contrast, for example. The code words are then read out. The code includes even further check information in addition to the actual data. This additional information, for example with a checksum or a correction data value, are used to determine with a test process whether the code was read correctly. The test process can follow the reading of the code or the decoding and checking are a unitary method.

The invention starts from the basic idea of carrying out a pre-correction in which a code word is replaced at at least one position of the code, and indeed with a code word of which it is known that it belongs at this position. This is based on pre-knowledge of the known code word. Whether the known code word is actually present at this position in the currently read code is first only an assumption as part of the pre-correction. The replacement with a known code word can take place at a position, at a plurality of positions, or even at all the positions for which a code word is known. It is also conceivable to try out combinations both with respect to the position and to the code words known for this position. However, this has effects on the run time and, in addition, the probability for a correct reading depends on how reliable the pre-knowledge of a specific known code word is at a position so that there is preferably only one respective candidate for a known code word at one position and at most only a few.

After the pre-correction with the replacement of a code word, it is found by the test process whether the code is now read correctly or can be read. This can be the first reading attempt for this code in which the previously unknown reading result at a position is replaced from the start with the known code word. It can only be the check of an earlier reading result modified by the pre-correction, for instance using a checksum, without decoding again. The test process preferably comprises a repeat reading attempt. This then relates to the particularly relevant case that despite the replacement with a known code word there are still errors at other positions that can then be corrected in a subsequent reading attempt because now the correction capacity of the test process is sufficient due to the replacement.

The invention has the advantage that the reading rate can be further increased. Due to the pre-correction, at least some codes can still be read despite destruction or defects in which otherwise even a reading process with error correction fails due to the exceeding of the correction capacity. In contrast to conventional brute force approaches with permuting of possible code words, there are no critical run time losses since preferably only a single pre-correction takes place and at most only one manageable number of attempts is necessary. The risk of misreads remains small here. It depends on the how reliable the pre-knowledge of the known code words is. It is preferably acquired from a history of previously read codes and is then empirically proven. The trust level can be set by demands in the application as to the manner in which code words have to appear repeatedly before they can count as known. In addition, the test process recognizes whether the code has been reliably recognized overall.

The pre-correction is preferably only carried out when the code was not able to be previously read according to the test process. There is therefore first a reading attempt without pre-connection. If the code could thus be read correctly in accordance with the test process, this reading process is concluded. Otherwise, the pre-correction is carried out and the modified reading result is then checked again or a new reading attempt is made on the basis of the result with a pre-correction.

The test process preferably corrects reading errors. Not only the read code is therefore checked for correctness, but the redundant information or the correction code words is/are used to correct unread or misread code words. The pre-correction expands the correction procedure of the test process, i.e. it also at least enables a correction in some cases when the test process could no longer do so on its own. The pre-correction thus helps to surpass the correction capacity of the test process.

The test process preferably has a Reed-Solomon error correction. An error correction of the reading process naturally also has to be supported by the code type used. The Reed-Solomon error correction is widespread for a large number of common code types in this respect of which some were named in the introduction. This distribution is also justified since Reed-Solomon is tried and tested and robust. The possibility of even decoding codes having great destruction or defects in which even the Reed-Solomon correction capability is no longer sufficient increases through the pre-correction. However, except for the abstract capability of correcting code words, the invention does not use any specific properties of Reed-Solomon and is therefore not restricted thereto provided that a different correction process for codes to be read is used.

For the case that the test process has to correct a known code word at a position replaced in the pre-correction, this known code word for this position is preferably no longer considered as known. The pre-knowledge of the known code word at this position is thus no longer trusted. This is meaningful in embodiments in which particularly high demands are made on the reliability of the known code words. Provided that the condition is not made for the pre-correction that a known code word always has to occur and in each code at its position, at least for the direct past, the known code word can also be reused for following reading processes despite the correction by the test process.

Known code words and their positions are preferably taught from a history of read codes. Accordingly, a plurality of codes are read, preferably sequentially in the same application, and this forms the history of read codes from which conclusions for known code words can be drawn. Alternatively to a teaching from the history, it is also conceivable to specify or parameterize the known code words differently. It can thus be known that some of the code words in an application carries the same information such as a manufacturer abbreviation or a lot number always or at least at times. It would be conceivable to compare the reading of the codes with a database system to compare such fixed components of the codes to be read and keep them up to date.

A code word is preferably assumed as known for a position when it occurs at least once at the position in the history. A pool of code words results from this for the pre-correction that have already occurred once at the respective position. This condition is weak; it is therefore easily possible that the pre-correction replaces using a code word that does not belong at its position. The test process forms a filter against such incorrectly replaced known code words.

A code word is even more preferably assumed as known for a position when it occurs at least n times at the position in the history. Depending on how large n is in comparison with the total history, it becomes correspondingly more probable that the code word to be replaced at the respective position is actually the known code word in the current code.

A code word is preferably assumed as known for a position when it repeats at least n times at the position in the history. In this even stricter criterion, the code word has to be repeated, that is it must be read in an uninterrupted manner n times after one another. With higher demands on known code words, the probability increases that the pre-correction makes possible a reading of the correct code content. However, in return there are also fewer possibilities available for a pre-correction, in particular when code words only repeat rarely or not n times at all in the history.

A code word is preferably assumed as known for a position when another code having this code word had been directly previously read at this position. The direct history is consequently observed here and it is required that nothing else was read directly before the current reading attempt at the position of the known code, and indeed in particular in combination with the already known criteria at least for the directly previously read code, preferably in an uninterrupted manner for the n directly previously read codes.

The pre-corrections is preferably only carried out when a code word is known at at least one position. As long as a known code word is not present for any position from the history or from another source, no pre-correction accordingly takes place. The teaching phase preferably has to be concluded, that is one of the criteria for already previously read code words having the required frequency or uninterrupted repetition in particular has to be satisfied up to the current reading attempt. If codes have no repeating sections in an application, it is possible that the pre-correction that is possible per se has not been used for a long time or at all. It would also hardly be able to provide a gain in such an application. The teaching phase can then also be successfully ended very quickly using the weakest criterion that a code word is already known if it had been read once at some point; however, this pre-knowledge is so weak that hardly any improvement in the reading rate can be expected with it with greatly varying codes. The criterion for known code words should therefore preferably be selected with regard to the codes occurring in the application.

The invention will be explained in more detail in the following also with respect to further features and advantages by way of example with reference to embodiments and to the enclosed drawing. The Figures of the drawing show in:

FIG. 1 a schematic three-dimensional overview representation of the exemplary installation of a code reader above a conveyor belt on which objects having codes to be read are conveyed;

FIG. 2 an exemplary representation of some read codes having repeating code sections;

FIG. 3 a tabular representation for explaining how repeating code sections can be localized;

FIG. 4 a tabular representation of code words known through repetition and their associated code contents; and FIG. 5 a tabular representation of a pre-correction of a previously non-readable code using repetition of known code words with a subsequent successful reading attempt.

FIG. 1 shows an optoelectronic code reader 10 which is mounted above a conveyor belt 12 which conveys objects 14 through the detection zone 18 of the code reader 10, as indicated by the arrow 16. The objects 14 bear code regions 20 on their outer surfaces which are detected and evaluated by the code reader 10. These code regions 20 can only be recognized by the code reader 10 when they are affixed to the upper side or at least in a manner visible from above. Differing from the representation in FIG. 1, a plurality of code readers 10 can therefore be installed from different directions for the reading of a code 22 affixed somewhat to the side or to the bottom in order to permit a so-called omnireading from all directions. The arrangement of the plurality of code readers 10 to form a reading system mostly takes place as a reading tunnel in practice. This stationary use of the code reader 10 at a conveyor belt is very common in practice. The invention, however, relates to the reading of codes or to the code reader 10 itself so that this example may not be understood as restrictive.

The code reader 10 detects image data of the conveyed objects 14 and of the code regions 20 with a light receiver and said image data are further processed by an evaluation unit 26 by means of image evaluation and decoding processes. It is not the specific imaging process that is important for the invention so that the code reader 10 can be set up in accordance with any principle known per se. For example, only one respective line is detected, either by means of a linear image sensor or by means of a scanning process, and the evaluation unit assembles the lines detected in the course of the conveying movement to the image data. A larger region can already be detected in a shot using a matrix-like image sensor, with the assembly of shots here also being possible both in the conveying direction and transversely thereto. The code reader 10 outputs information such as read codes or image data via an interface 28.

An improvement of the decoding process with which the code reader 10 reads codes by a pre-correction will be explained in the following with reference to FIGS. 2 to 5. It is preferably carried out in the evaluation unit 26. It is, however, equally conceivable to output image data or intermediate results via the interface 28 and to outsource at least some of the decoding to a higher ranking system such as a control processor, a network, or a cloud. Pre-processing of the image data for segmentation and for localizing code regions 20 and the decoding per se are assumed as known and not described. In addition, the invention will be explained for the example of code reading using a Reed-Solomon correction. In this respect, it is not a question of the specific Reed-Solomon process, but rather its ability to be able to correct code words up to a specific number of errors. Other test or correction processes are equally conceivable provided the code type to be read supports them. It is sufficient in some embodiments if the test process cannot correct errors, but only validates the read code content.

FIG. 2 shows an exemplary representation of some read codes, here DataMatrix codes of a code length 45. Such a sequence of codes is also called a history. In many real applications, the read codes are not completely different from one another, but there are rather constantly repeating portions. Examples are goods similar to one another and having codes, for instance cigarette packs, a manufacturer identifier included in the code within a system, serial numbers that are only counted up at the end, and many others.

The codes shown in FIG. 2 originate from an image sequence A and from an image sequence B recorded an hour later. There are evidently repeating characters in the application in which the codes were read which are divided into two blocks here: 010871848116971121 and <1d>240FA062838.03. Decoded characters are shown here, not the code words from which the characters were acquired. If the changing characters are marked by "?", all the read codes can be shown in this form:

010871848116971121?????????????<1d>240FA062838.03

The 18+15 fixed characters in this case even form the majority with respect to the 13 variable characters.

The pre-correction in accordance with the invention makes use of the pre-knowledge of repeating code words and corresponding characters. Such code words are assumed as known for their position for the further operation.

In a preferred embodiment, the conventional reading operation is continued until a reading error occurs on the attempted reading of a code. In this code, too many code words are affected by defects or other disturbances and the capacity of the Reed-Solomon correction is therefore not sufficient. A code word of the code to be read is then replaced with the known code word at at least one position; either anywhere or preferably, so that the pre-correction also has an effect, directly at a position where the previous decoding result differs from the known code word. A reading attempt is subsequently made again using a Reed-Solomon correction. If the pre-correction with the known code word has inserted the correct code word at its position, the correction capacity of the Reed-Solomon correction is now possibly sufficient to read the total code. Otherwise a further attempt can follow with replacements with other code words or with more code words known for their respective positions.

Alternatively, no attempt at all is made to read the total code with a Reed-Solomon correction. Some or all of the positions are replaced right from the start with a code word respectively known for this position. In the above example, only the comparatively few code words that correspond to the "?" then have to be decoded and it becomes substantially less probable that the capacity of the Reed-Solomon correction is exceeded. This procedure should preferably only be selected when the known code words are located in the codes at their respective positions with a correspondingly high probability and when the pre-knowledge of this fact is also correspondingly reliable.

In accordance with both procedures, the pre-correction can therefore provide that an otherwise unreadable code is also nevertheless made accessible to the Reed-Solomon correction and can thus increase the reading rate.

FIG. 3 shows a tabular representation with reference to which a teaching phase for teaching repeating code sections is described by way of example to localize code words for respective positions.

The aim here is to discover whether recurring data code word sequences occur in the current application situation. If that is the case, repeated code words are taught as known at their respective positions and are used for the pre-correction.

The table in FIG. 3 shows an example for the code type DataMatrix having a symbol size 14×14 and a data code word length 8. The previously known code words for the eight positions CW1 . . . CW8 are stored in the variable CW_repetition.

Non-repeated positions are marked by a specific maker, here −1. If such a marker also remains at the end of the teaching phase, it corresponds to the above "?". It must be noted here that decoded characters are at the "?" above, but CW_repetition includes code words. They are ultimately mergeable into one another, but not the same. A code word can stand for two characters (example: CW5=197 corresponds to the two characters "67"); conversely, two code words can stand for one Kanji character. The positions in the decoded characters are therefore also not necessarily identical to those of the code words to which positions in the embodiment and for CW_repetition relate.

The previous value (old) of CW_repetition is entered in the topmost line of the table in FIG. 3. The second line shows a currently read code that is compared therewith. The value (new) of CW_repetition modified by this current code is in the third line.

The respective read code word agrees with the previously repeated code word in accordance with CW_repetition of the first line for the currently read exemplary code of the second line at the positions CW1-CW5 and CW8 and they are therefore taken over into the third line. A difference results at the position CW6 so that here the marker −1 is now set for a non-repeated code word. There was previously already no repetition at the position CW7 and this is thus taken over.

CW_repetition is, for example, initialized by a first successfully read code. During the teaching phase, the Reed-Solomon correction is preferably already used; the pre-correction, however, not yet since known code words have still not been taught. Since only successfully read codes are utilized for the teaching, the specific reading process with which this information is acquired ultimately plays no role.

After a specific number of successfully read codes with which CW_repetition is modified, the teaching is concluded. This number is a parameter of the process that reflects the required trust in the code words known for their respective positions and can also be subject to conditions, for instance that a specific number of codes has to be read in which CW_repetition no longer changes.

The described process requires that a code word has to repeat at a position during the total teaching to be considered known. Other criteria are also conceivable. For example, CW_repetition can also be a field for a plurality of code words per position and how often these code words occur, in particular successively in an uninterrupted manner, during the teaching is counted. Code words are then not only considered as known if they were always to be found at their positions, but rather already from a specific number or frequency. In this respect, only the most frequent code word per position can respectively be taught as known. It is, however, also conceivable to use a plurality of code words occurring most frequently for a plurality of attempts of a pre-correction with different hypotheses in which the candidates for known code words are worked through. The trust in the pre-knowledge of known code words is evidently smaller with such weaker criteria and there are also effects on the run time with a plurality of attempts of a pre-correction. More applications can be considered for this in which the process can be used.

After conclusion of the teaching phase, it is recognized in the variable CW_repetition whether at least one repeating data code word corresponding to the predefined criterion exits in the present application situation. If that is the case, the pre-correction can subsequently be used in an operating phase or evaluation phase.

The known code words in another respect do not necessarily have to be taught. The corresponding pre-knowledge can also be acquired in a different manner, for instance by parameterization or communication with a database of a higher ranking system in which the code reader 10 is used.

FIG. 4 shows as the starting point exemplary values of the variable CW_repetition for the pre-correction together with their decoding. The teaching process that can generally run in parallel with the other operation is now concluded and the required criterion for CW_repetition is accordingly satisfied. The system preferably comprises a flag by which it is indicated that CW_repetition may be used and teaching is no longer ongoing.

FIG. 5 is a tabular representation of a reading attempt with pre-correction. At this point in time, after the teaching, general code information such as data code word length, symbol size, and code type are known. It is conceivable that the code reader 10 teaches a respective pre-correction for different code word lengths, symbol sizes, and code types and uses it in dependence on code currently to be read. The structure of the table is the same as in FIGS. 3 and 4 and the first line again shows the values of CW_repetition. Pre-knowledge in the form of code words known for these positions is therefore available at the positions CW1 . . . CW5 and CW8. The proportion of the known code words can naturally be larger or smaller in other cases.

The result of a reading attempt of a code currently to be read, preferably by means of a Reed-Solomon correction, is shown in the second line. The decoder has returned a reading error (NoRead, Reed-Solomon Error) because the error correction capacity has been exceeded.

As part of the pre-correction, at least one of the stored repeating data code words of CW_repetition is now used in the first line of the table to thus overwrite the data code word of the second line read at this position. The result of this pre-correction is entered in the third line of the table. Provided only one or a few of the currently read data code words are replaced with data code words from CW_repetition, this should take place at points at which there is also a difference. In FIG. 5 that would be the positions CW1 . . . CW4. On a replacement only at the positions CW5 and CW8, the pre-correction would be effectively useless. It is also conceivable to carry out a plurality of attempts with pre-corrections at different positions. A very simple and promising possibility comprises carrying out a pre-correction with all known code words directly without a comparison in a step. The code words of the currently read codes of the second line are therefore taken over at the positions marked with "−1" or "?" having a variable content; at the other positions with a repeated content, the code words from CW_repetition of the first line are taken over.

After the pre-correction of the data code words, the Reed-Solomon correction is now again used to also correct errors at the positions with non-repeating content. If it has been possible through the pre-correction first to replace misread code words with correct code words, some of the error correction capacity is thereby released. In the example of FIG. 5, in which the result of the Reed-Solomon correction is entered in the fourth line of the table, no further correction was actually required. The reading rate is thus improved by two stages: Unreadable code words are replaced from pre-knowledge in the pre-correction. It is additionally thereby made possible to correct other errors as part of the Reed-Solomon correction.

The Reed-Solomon correction would also have recognized if one of the replacements by the pre-correction does not apply to the code to be read. At this point, the pre-correction would then not have had any useful effect, but would rather have continued to make use of the error correction capacity. This then means that the code word at the respective positions, contrary to the assumption, does not agree with CW_repetition, which preferably has the same effects on CW_repetition as if a code word is not repeated during the teaching.

The error correction capacity is possibly still exceeded despite the pre-correction. This can be due to the fact that the pre-correction has replaced a code word at at least one position that does not belong there in the code to be currently read, that is has not eliminated an error or has even introduced an additional error. It is also conceivable that the pre-correction was completely correct, but that too many errors are still included in the variable part of the code. In such cases, a reading error also remains after both stages of pre-correction and Reed-Solomon correction.

The last line of the table in FIG. 5 shows the decoding result for the code read after a two-fold correction process.

CW_repetition is preferably also further updated as in the teaching phase during the operation with pre-correction. It can thereby be recognized if previously repeating code words now change after all at their respective positions. In such a case, the teaching phase for CW_repetition should then preferably start again at least for the affected positions and a pre-correction should no longer take place up to its conclusion.

The variable CW_repetition and thus values related thereto can be output via the interface 28. This makes a diagnosis possible and is useful, for example, if the reading situation should be reenacted subsequently or for simulation purposes.

The method in accordance with the invention for reading codes with pre-correction increases the reading rate in applications in which there is a frequently repeating portion of data code word sequences. Depending on the repeating portion of the codes compared with the variable portion, this makes it possible to read codes with deficiencies or defects even far beyond the error correction capacity of the Reed-Solomon correction.

The invention claimed is:

1. A method of reading an optical code, comprising the steps of:
    reading, with an optoelectronic code reader, an optical code having a plurality of code words;
    recording image data corresponding to the optical code in memory;
    performing a test process to determine whether the code is read correctly;
    if the test process determines that the code was not read correctly, then performing a pre-correction to replace one of the code words at a known position within the optical code with a replacement code word which is known to correspond to the known position for this position in a pre-correction; and
    if the pre-correction was performed, then returning to the step of performing the test process.

2. The method in accordance with claim 1, wherein the test process corrects reading errors.

3. The method in accordance with claim 2, wherein the test process comprises a Reed-Solomon error correction.

4. The method in accordance with claim 1, wherein the replacement code word belongs to a set of replacement code words, the set of replacement code words and a corresponding set of known positions are stored in a history of read codes recorded in the memory.

5. The method in accordance with claim 4, wherein a code word is considered to be a known code word for purposes as a viable replacement code word for a known position when the code word occurs at least once at the known position in the history of read codes.

6. The method in accordance with claim 4, wherein a code word is considered to be a known code word for purposes as a viable replacement code word for a known position when the code word occurs at least n times at the known position in the history of read codes.

7. The method in accordance with claim 4, wherein a code word is considered to be a known code word for purposes as a viable replacement code word for a known position when the code word repeats at least n times at the known position in the history of read codes.

8. The method in accordance with claim 4, wherein a code word is considered to be a known code word for purposes as a viable replacement code word for a known position when another code having this code word had been directly previously read at the known position.

9. The method in accordance with claim 1, wherein the pre-correction is only carried out when a code word is known at at least one position.

10. An optoelectronic code reader, comprising:
    at least one light reception element for generating image data from received light; and
    an evaluation unit in which a method of reading optical codes is implemented, the method of reading optical codes comprising the steps of:
        reading, with an optoelectronic code reader, an optical code having a plurality of code words;
        recording image data corresponding to the optical code in memory;
        performing a test process to determine whether the code is read correctly;
        if the test process determines that the code was not read correctly, then performing a pre-correction to replace one of the code words at a known position within the optical code with a replacement code word which is known to correspond to the known position for this position in a pre-correction; and
        if the pre-correction was performed, then returning to the step of performing the test process.

* * * * *